(12) United States Patent
Takasawa et al.

(10) Patent No.: US 8,299,529 B2
(45) Date of Patent: Oct. 30, 2012

(54) METHOD FOR PRODUCING THIN FILM TRANSISTOR AND THIN FILM TRANSISTOR

(75) Inventors: Satoru Takasawa, Sammu (JP); Satoru Ishibashi, Sammu (JP); Tadashi Masuda, Tomisato (JP)

(73) Assignee: Ulvac, Inc., Chigasaki-shi (JP)

( * ) Notice: Subject to any disclaimer, the term of this patent is extended or adjusted under 35 U.S.C. 154(b) by 94 days.

(21) Appl. No.: 12/881,652

(22) Filed: Sep. 14, 2010

(65) Prior Publication Data
US 2011/0068338 A1    Mar. 24, 2011

Related U.S. Application Data

(63) Continuation of application No. PCT/JP2009/057492, filed on Apr. 14, 2009.

(30) Foreign Application Priority Data

Apr. 25, 2008   (JP) .................................. 2008-115996

(51) Int. Cl.
*H01L 27/01* (2006.01)
*H01L 21/00* (2006.01)

(52) U.S. Cl. ............... 257/350; 257/368; 257/E29.291; 257/E29.294; 438/149; 438/151; 438/161

(58) Field of Classification Search ............ 438/149, 438/151, 161, 164; 257/347, 350, 368
See application file for complete search history.

(56) References Cited

U.S. PATENT DOCUMENTS

2008/0278649 A1* 11/2008 Koike et al. .................. 349/42
2009/0173945 A1*  7/2009 Takasawa et al. ........... 257/66

FOREIGN PATENT DOCUMENTS

| JP | 4-192527 | 7/1992 |
| JP | 4-302436 | 10/1992 |
| JP | 6-252146 | 9/1994 |
| JP | 11-54458 | 2/1999 |
| JP | 2001-73131 A1 | 3/2001 |

OTHER PUBLICATIONS

International Search Report for International Application No. PCT/JP2009/057492 dated May 25, 2009.

* cited by examiner

*Primary Examiner* — Hsien Ming Lee
(74) *Attorney, Agent, or Firm* — Kratz, Quintos & Hanson, LLP

(57) ABSTRACT

A metallic wiring film, which is not exfoliated even when exposed to plasma of hydrogen, is provided. A metallic wiring film is constituted by an adhesion layer in which Al is added to copper and a metallic low-resistance layer which is disposed on the adhesion layer and made of pure copper. When a copper alloy including Al and oxygen are included in the adhesion layer and a source electrode and a drain electrode are formed from it, copper does not precipitate at an interface between the adhesion layer and the silicon layer even when being exposed to the hydrogen plasma, which prevents the occurrence of exfoliation between the adhesion layer and the silicon layer. If the amount of Al increases, since widths of the adhesion layer and the metallic low-resistance layer largely differ after etching, the maximum addition amount for permitting the etching to be performed is the upper limit.

8 Claims, 4 Drawing Sheets

METHOD FOR PRODUCING THIN FILM TRANSISTOR AND THIN FILM TRANSISTOR

This application is a continuation of International Application No. PCT/JP2009/057492 filed on Apr. 14, 2009, which claims priority to Japanese Patent Document No. 2008-115996, filed on Apr. 25, 2008. The entire disclosures of the prior applications are herein incorporated by reference in their entireties.

BACKGROUND OF THE INVENTION

The present invention relates to a transistor having electrode films composed of a copper alloy and a method for producing such a transistor.

BACKGROUND ART

Conventionally, metallic wiring films are connected to a source area and a drain area of a TFT (thin film transistor) inside an electronic circuit of, such as, the TFT or the like.

Recently, since the TFTs and the wiring films have been being made finer and finer, wiring films which have copper as a main ingredient are used to obtain wiring films having low resistances.

However, experiments revealed that although the wiring films made mainly of copper have high adhesion to silicon, exfoliation may occur when TFTs are produced by using the copper wiring films, which is the problem to be solved.

See, Japan Patent documents JP-A 2001-73131 and JP-A 11-54458.

SUMMARY OF THE INVENTION

The inventors of the present invention ascertained that the cause of deterioration of the adhesion between the copper wiring film and the silicon layer lies in a treatment for improving the characteristics of the TFT in which the silicon layer is exposed to a hydrogen plasma, which takes place in a production step of the TFT in restoring the damage to the silicon layer.

Since pure copper has poor adhesion to silicon, a metallic wiring film used in forming a source electrode film and a drain electrode film is designed in a two-layer structure of an adhesion layer made of a copper alloy to which magnesium and oxygen are added to render high adhesion to silicon, and a metallic low-resistance layer made of pure copper having a resistance lower than that of the adhesion layer.

When such a metallic wiring film is exposed to the hydrogen plasma, a copper compound in the adhesion layer is reduced, so that pure Cu precipitates at an interface between the silicon and the adhesion layer, which deteriorates the adhesion.

As a result of investigation and a study of additives for preventing pure copper from precipitation at the interface between the copper wiring film and silicon, the inventors of the present invention found the use of an oxide of Al in producing the present invention.

That is, an embodiment of the present invention is directed to a method for producing a thin film transistor of an inverted staggered type, including the steps of forming a gate electrode on an object to be processed; forming a gate insulation layer on the gate electrode; forming a semiconductor layer on the gate insulation layer; forming an ohmic contact layer on the semiconductor layer; forming a metallic wiring layer on the ohmic contact layer; and forming first and second ohmic contact layers, a source electrode, and a drain electrode by patterning the ohmic contact layer and the metallic wiring film. The step of forming the metallic wiring film includes a step of sputtering a target of a copper alloy having Al and copper in a vacuum atmosphere with a gas including a sputtering gas and oxidizing gas for forming an adhesion layer having copper, Al and oxygen on the ohmic contact layer.

The present embodiment may be directed to a method for producing the thin film transistor, wherein the copper alloy target is made so as to include Al at a rate of between at least 5 atom % and at most 30 atom %.

The present embodiment may be directed to a method for producing the thin film transistor, further including the step of, after forming the adhesion layer, forming a metallic low-resistance layer on the adhesion layer, the metallic low-resistance layer having a higher copper content rate than that of the adhesion layer and a resistance lower than that of the adhesion layer.

The present embodiment may be directed to a method for producing the thin film transistor, wherein an $O_2$ gas is used as the oxidizing gas, and the $O_2$ gas is included in a range of between at least 0.1 parts by volume and at most 15 parts by volume relative to 100 parts by volume of the sputtering gas.

The present embodiment may be directed to a method for producing the thin film transistor, wherein a $CO_2$ gas is used as the oxidizing gas, and the $CO_2$ gas is included in a range of between at least 0.2 parts by volume and at most 30 parts by volume relative to 100 parts by volume of the sputtering gas.

The present embodiment may be directed to a method for producing the thin film transistor, wherein an $H_2O$ gas is used as the oxidizing gas, and the $H_2O$ gas is included in a range of between at least 0.1 parts by volume and at most 15 parts by volume relative to 100 parts by volume of the sputtering gas.

An embodiment of the present invention is directed to a thin film transistor of an inverted staggered type, including: a gate electrode formed on an object to be processed; a gate insulation layer formed on the gate electrode; a semiconductor layer formed on the gate insulation layer; first and second ohmic contact layers, which are separated from each other, formed on the semiconductor layer; and a source electrode and a drain electrode formed on the first and the second ohmic contact layers, respectively, wherein the source electrode and the drain electrode have adhesion layers on surfaces which contact the first and the second ohmic contact layers, the adhesion layers having a copper alloy including Al and oxygen.

The present embodiment may be directed to the thin film transistor, wherein the first and second ohmic contact layers are n-type semiconductor layers.

The present embodiment may be directed to the thin film transistor, wherein a metallic low-resistance layer, which has a content rate of copper higher than that of the adhesion layer and a resistance lower than that of the adhesion layer, is arranged on the adhesion layer.

The present embodiment may be directed to the thin film transistor, wherein Al is included at a rate of between at least 5 atom % and at most 30 atom % in the metals which is included in the adhesion layer.

It is noted that semiconductors composed mainly of silicon (such as polysilicon, amorphous silicon or the like) are called the silicon layer in the present invention.

Since the electrode film is not peeled even when exposed to the hydrogen plasma, the yield increases.

DETAILED DESCRIPTION OF THE INVENTION

Figure 1:
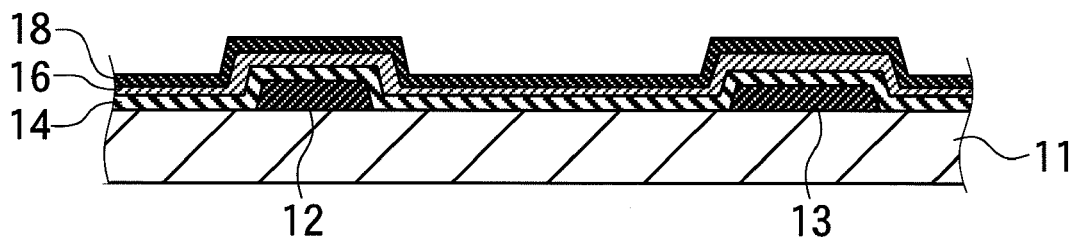
FIG. 1(a) is a cross-sectional view for illustrating a method for producing the transistor used in an embodiment of the present invention.
FIG. 1(b) is a cross-sectional view for illustrating the method for producing the transistor used in an embodiment of the present invention.
FIG. 1(c) is a cross-sectional view for illustrating the method for producing the transistor used in an embodiment of the present invention.
FIG. 1(d) is a cross-sectional view for illustrating the method for producing the transistor used in an embodiment of the present invention.
FIG. 1(e) is a cross-sectional view for illustrating the method for producing the transistor used in an embodiment of the present invention.
FIG. 1(f) is a cross-sectional view for illustrating the method for producing the transistor used in an embodiment of the present invention.
FIG. 1(g) is a cross-sectional view for illustrating the method for producing the transistor used in an embodiment of the present invention.
FIG. 1(h) is a cross-sectional view for illustrating the method for producing the transistor used in an embodiment of the present invention.
FIG. 1(i) is a cross-sectional view for illustrating the method for producing the transistor used in an embodiment of the present invention.
Figure 1:
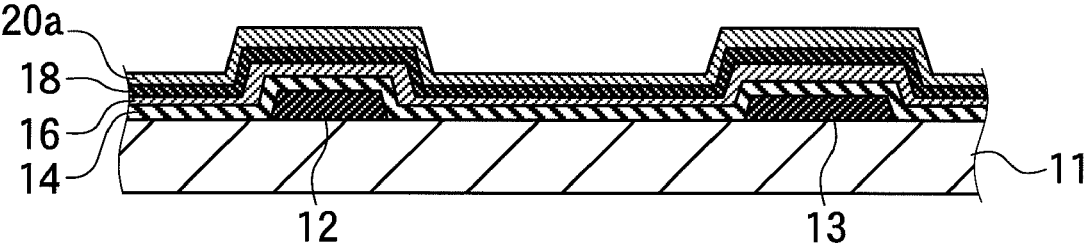
Figure 1:
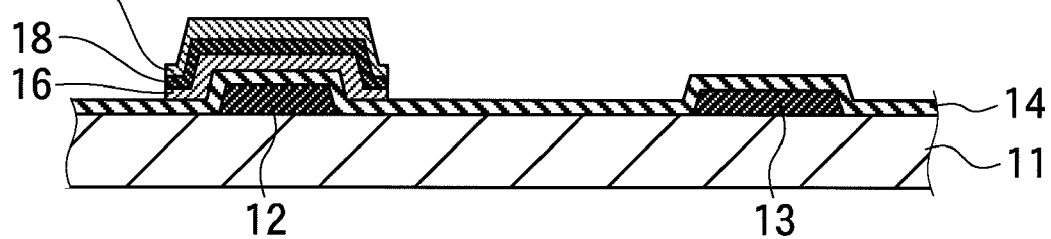
Figure 1:
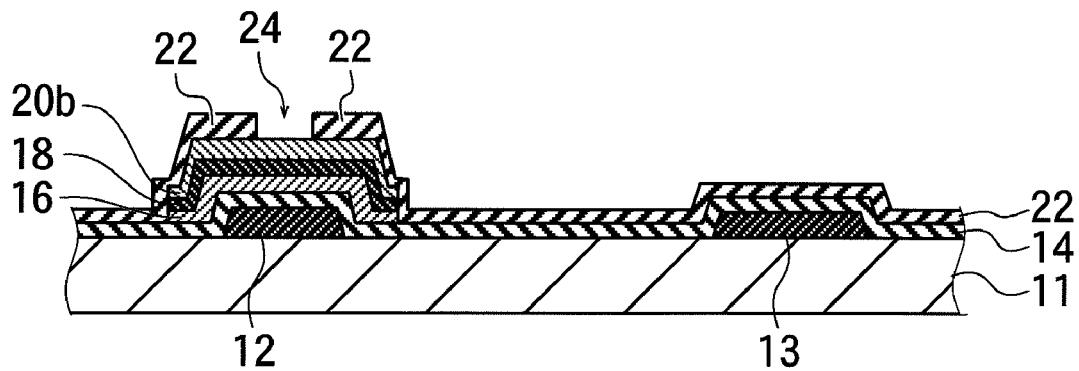
Figure 1:
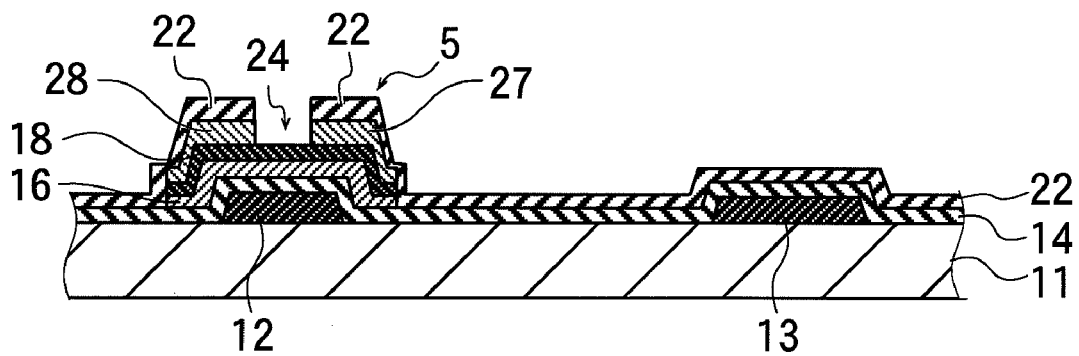
Figure 1:
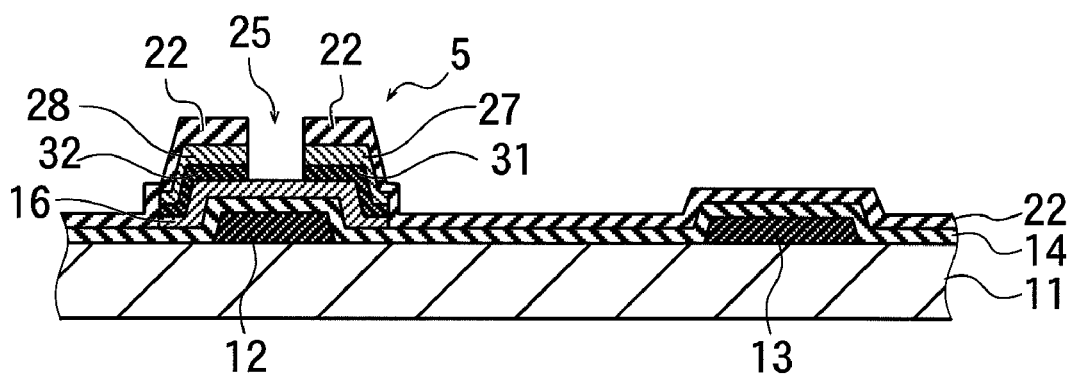
Figure 1:
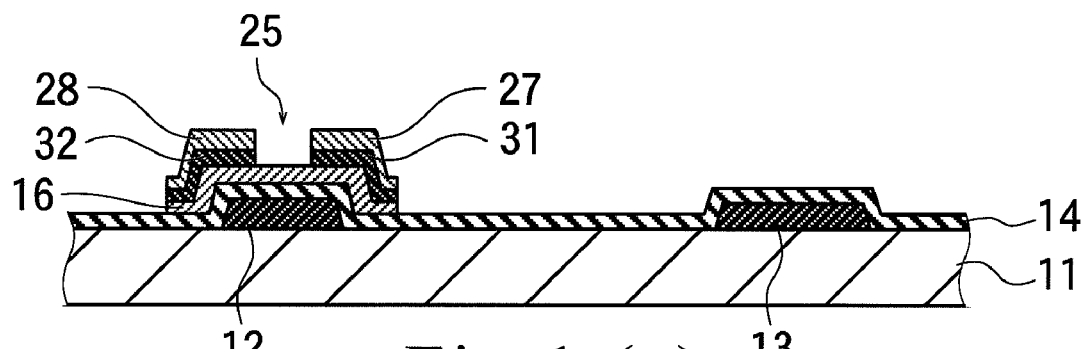
Figure 1:
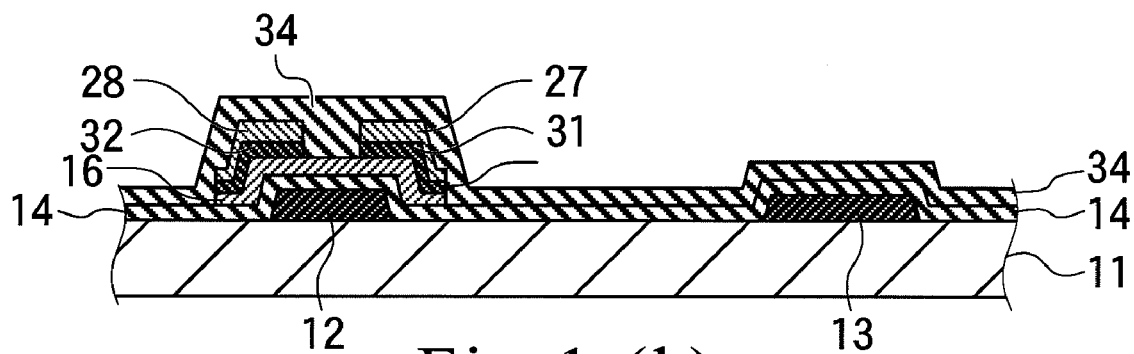
Figure 1:
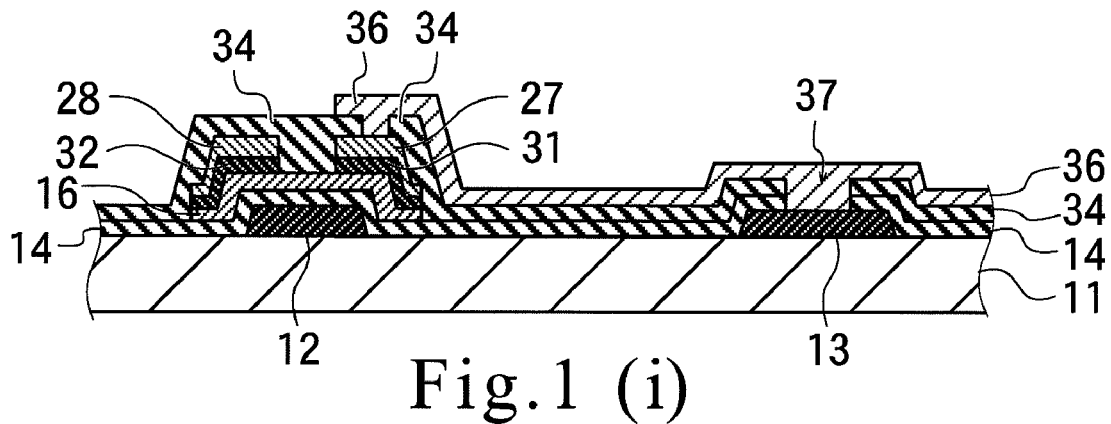

In FIG. 1(a), a reference numeral 10 denotes an object to be processed, for which the transistor producing method according to an embodiment of the present invention is to be used.

The object 10 to be processed has a transparent substrate 11 made of glass or the like; and a gate electrode 12 and a pixel electrode 13 are arranged spaced-apart on the transparent substrate 11.

A gate insulation film 14, a silicon layer 16 and an n-type silicon layer 18 are placed on the transparent substrate 11 in this order from a side of the transparent substrate 11, covering the gate electrode 12 and the pixel electrode 13. The n-type silicon layer 18 is a silicon layer in which a resistance value is made smaller than that of the silicon layer 16 by adding an impure substance. In this embodiment, the n-type silicon layer 18 and the silicon layer 16 are constituted by amorphous silicon, but they may be a single crystal or polycrystal. The gate insulation layer 14 is an insulation film (such as, a thin film of silicon nitride or the like), but it may be a film of silicon oxynitride film or another insulation film.

Figure 3:
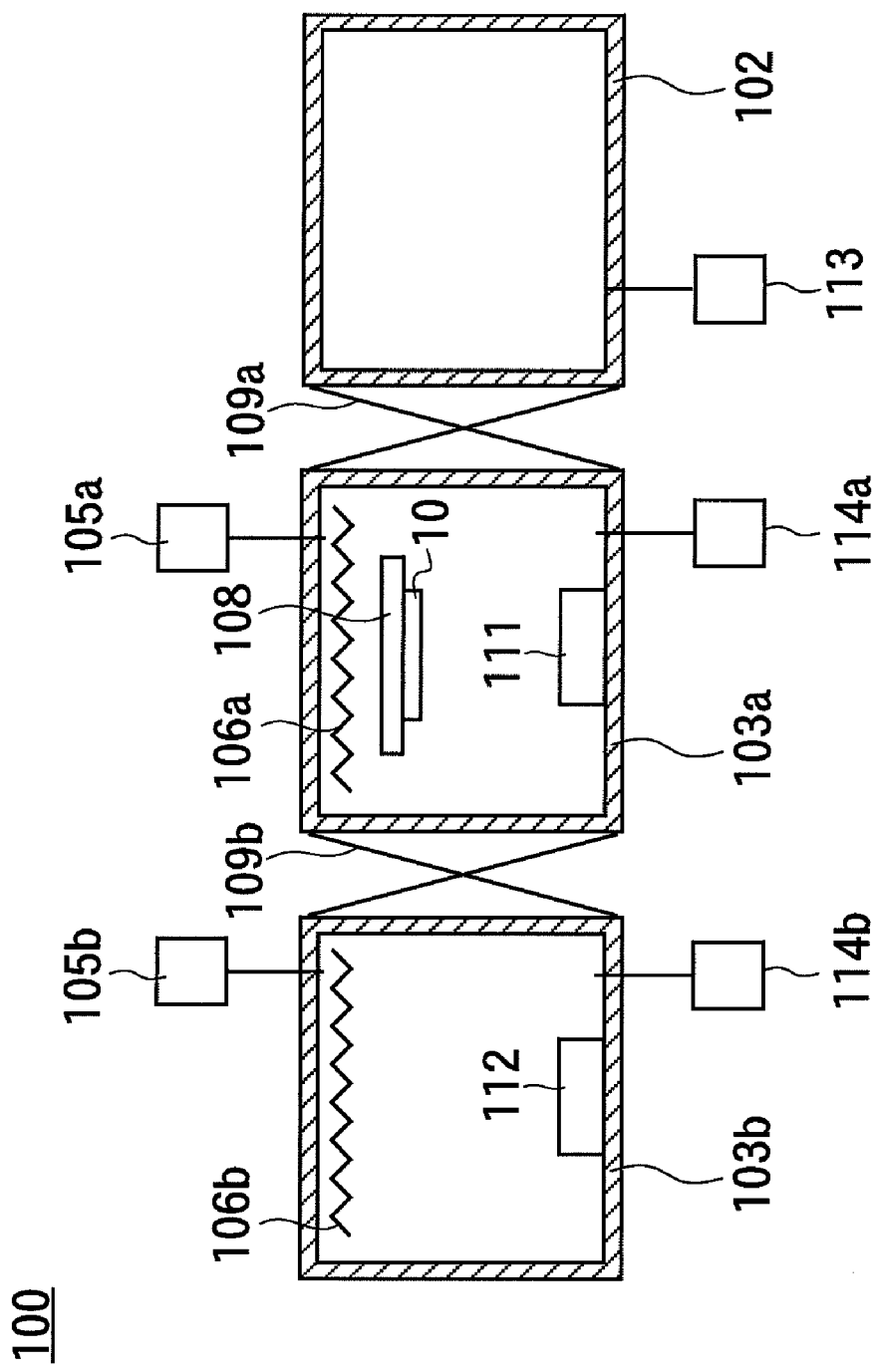
FIG. 3 is a schematic block diagram for illustrating a film forming apparatus for use in producing the transistor in an embodiment of the present invention.

In FIG. 3, a reference numeral 100 denotes a film forming apparatus for use in forming a metallic wiring film on a surface of the object 10 to be processed.

The film forming apparatus 100 has a carrying in/out chamber 102, a first film forming chamber 103a, and a second film forming chamber 103b. The carrying in/out chamber 102 and the first film forming chamber 103a, and the first film forming chamber 103a and the second film forming chamber 103b are connected via gate valves 109a and 109b, respectively.

Vacuum evacuating systems 113, 114a, 114b are connected to the carrying in/out chamber 102 and the first and second film forming chambers 103a, 103b, respectively. Accordingly, while the gate valves 109a, 109b are closed, the interiors of the first and second film forming chambers 103a, 103b are preliminarily evacuated to vacuum.

Next, a door between the carrying in/out chamber 102 and the air is opened, an object 10 to be processed is carried into the carrying in/out chamber 102, and the door is closed; then, after the interior of the carrying in/out chamber 102 is evacuated to vacuum, the gate valve 109a is opened, and the object 10 to be processed is moved into the first film forming chamber 103a so as to be held on a substrate holder 108.

A copper alloy target 111 and a pure copper target 112 are placed on sides of bottom walls inside the first and second film forming chambers 103a, 103b, respectively; and the object 10 to be processed is held on the substrate holder 108 such that the n-type silicon layer 18 may face each of the targets 111, 112.

Gas introduction systems 105a, 105b are connected to the first and second film forming chambers 103a, 103b, respectively, and when the copper alloy target 111 is sputtered by introducing a sputtering gas and an oxidizing gas from the gas introduction system 105a in a state such that the interior of the first film forming chamber 103a is being evacuated to vacuum, sputtered particles made of a constituting material of the copper alloy target 111 reach a surface of the n-type silicon layer 18, and an adhesion layer contacting the n-type silicon layer 18 is formed.

The copper alloy target 111 includes Al (aluminum) and copper. A metal other than copper and Al (for example, at least one of Ti, Ci, Zr, Mg, Ni and Mn) can be added as an additive metal to the copper alloy target 111, if needed.

When the total number of copper atoms, that of Al atoms and that of the other additive metal atoms, is taken as 100, Al is included 5 or more and 30 or less in the copper alloy target 111. In other words, Al is included at a rate of between at least 5 atom % and at most 30 atom % in the copper alloy target 111.

The oxidizing gas is a gas which oxidizes Al and produces an oxide of Al. Accordingly, when the copper alloy target 111 is sputtered, an adhesion layer having copper as a main ingredient and the oxide of Al is formed on a surface of the object 10 to be processed.

Thereafter, when the substrate holder 108 on which the object 10 to be processed is held is moved to the second film forming chamber 103b, and the sputtering gas is introduced from the gas introduction system 105b to sputter the pure copper target 112, sputtered particles made of copper atoms as the constituent material of the pure copper target 112 reach the surface of the object 10 to be processed; and a metallic low-resistance layer made of pure copper is formed on the surface of the adhesion layer. The oxidizing gas is not introduced into the second film forming chamber 103b.

Figure 2:
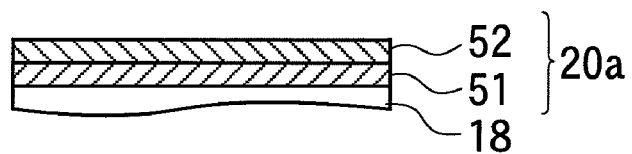
FIG. 2 is a cross-sectional view for illustrating a metallic wiring film.

In FIG. 1(b), a reference numeral 20a denotes a metallic wiring film composed of the adhesion layer and the metallic low-resistance layer; and reference numerals 51, 52 in FIG. 2 denote the adhesion layer and the metallic low-resistance layer, respectively.

A resist layer is placed on a surface of the portion of the metallic wiring film 20a which is located above the gate electrode 12, and by etching a laminated film composed of the metallic wiring film 20a, the n-type silicon layer 18 and the silicon layer 16, the portion of the laminated film which is not covered with the resist film is removed.

FIG. 1(c) shows a state in which the resist film is removed after etching the laminated film; and a reference numeral 20b shows the metallic wiring film that remains with the resist film thereon.

Next, as shown in FIG. 1(d), a patterned resist film 22 is placed on the metallic wiring film 20b, and then, by immersion into an etching liquid of a mixed liquid of phosphoric acid, nitric acid, and acetic acid; a mixed liquid of sulfuric acid, nitric acid, and acetic acid; or a solution of ferric chloride or the like, in a state such that a surface of the metallic wiring film 20b is exposed at a bottom face of an opening 24 of the resist film 22, the exposed portion of the metallic wiring film 20b is etched; thus, the metallic wiring film 20b is patterned.

Since the metallic low-resistance layer 52 has copper as a main ingredient, if the rate of Al in the adhesion layer 51 becomes too large, the metallic low-resistance layer 52 and the adhesion layer 51 largely differ in width after the patterning. Therefore, the rate of Al in the adhesion layer 51 is such that its upper limit is the maximum addition amount which permits the adhesion layer 51 and the metallic low-resistance layer 52 to be simultaneously etched.

By this patterning, the opening 24, where the n-type silicon layer 18 is exposed on the bottom face, is formed in the portion of the metallic wiring film 20b which is above the gate electrode 12, so that the metallic wiring film 20b is divided by the opening 24 in order to form a source electrode film 27 and a drain electrode film 28 as shown in FIG. 1(e), thereby obtaining the transistor 5 used in an embodiment of the present invention.

Next, the object is carried into an etching device, then by etching the n-type silicon layer 18 which is exposed to the bottom face of the opening 24 through being exposed to a plasma of an etching gas, a silicon layer 16 is exposed at a bottom face of an opening 24 formed in the n-type silicon layer 18.

The opening 24 formed in the n-type silicon layer 18 is in a position above the gate electrode 12; and the n-type silicon layer 18 is divided into a source area 31 and a drain area 32 by an opening 25 (FIG. 1 (f)).

A surface of the silicon layer 16 is exposed on a surface of the opening 25, and when the silicon layer 16 is exposed to the plasma of the etching gas in etching the n-type silicon layer 18, hydrogen atoms are lost from the surface of the silicon layer 16, which may result in the formation of dangling bonds.

Such dangling bonds cause inferiority in the characteristics of the TFT (such as, the occurrence of leak current). In order to modify the dangling bonds with hydrogen again, hydrogen is introduced in order to generate a hydrogen plasma, and then the silicon layer 16 which is exposed at the bottom of an opening 25 is exposed to the plasma of the hydrogen gas in a state such that the source electrode film 27 and the drain electrode film 28 are exposed as shown in FIG. 1(g), silicon atoms on the surface of the silicon layer 16 bind to hydrogen, thereby reducing the occurrence of the dangling bonds.

In the metallic wiring film 20a (20b) in this embodiment of the present invention, the source electrode film 27 and the drain electrode film 28 includes the adhesion layer 51 having copper as a main ingredient and Al at the rate of between at least 5 atom % and at most 30 atom %. Here, the rate of Al in the adhesion layer 51 is a value obtained by dividing the number of atoms of Al included in the adhesion layer 51 by the total number of atoms of the metallic components (copper, Al and the other additive(s)) contained in the adhesion layer 51, and multiplying the resultant value by 100. The rate of Al in the adhesion layer 51 is equal to that of Al in the copper alloy target 111.

The adhesion layer 51 tightly adheres to silicon and silicon dioxide of the transistor, so that even when the source electrode film 27 and the drain electrode film 28 are exposed to the hydrogen plasma, no copper precipitates at the interface between the n-type silicon layer 18 (and the source area 31 and the drain area 32), which prevents the electrode film constituted by the metallic wiring film 20a (20b) (such as, the source electrode film 27, the drain electrode film 28 or the like) from exfoliation.

Following the treatment with the hydrogen plasma, after a passivation film 34 is formed as shown in FIG. 1(h), and contact holes 37 are formed in the passivation film 34, a liquid crystal display panel is obtained by forming a transparent electrode film 36 in order to connect the source electrode film 27 or the drain electrode film 28 with the pixel electrode 13 as shown in FIG. 1(i).

Gases which are able to be used for etching the silicon layer (including a polysilicon layer and an amorphous silicon layer) are $Cl_2$, HBr, $Cl_2$, HCl, $CBrF_3$, $SiCl_4$, $BCl_3$, $CHF_3$, $PCl_3$, HI, $I_2$ or the like. One kind of these halogen gases may be used alone as the etching gas, or a mixture of two or more kinds thereof may be used as the etching gas. Further, an additive gas, such as, $O_2$, $N_2$, $SF_6$, $N_2$, Ar, $NH_3$ or the like, other than the halogen gases, may be added to the etching gas.

The halogen gases listed above can be used to etch other objects to be etched (such as, silicon nitride (SiN), silicon oxide ($SiO_2$), GaAs, $SnO_2$, Cr, Ti, TiN, W, Al or the like).

For etching gases for the polysilicon, for example, $Cl_2$, $Cl_2$+HBr, $Cl_2$+$O_2$, $CF_4$+$O_2$, $SF_6$, $Cl_2$+$N_2$, $Cl_2$HCl, HBr+$Cl_2$+$SF_6$ or the like can to be used.

For etching gases for Si, for example, $SF_6$, $C_4F_8$, $CBrF_3$, $CF_4$+$O_2$, $Cl_2$, $SiCl_4$+$Cl_2$, $SF_6$+$N_2$+Ar, $BCl_2$+$Cl_2$+Ar, $CF_4$, $NF_3$, $SiF_4$, $BF_3$, $XeF_2$, $ClF_3$, $SiCl_4$, $PCl_3$, $BCl_3$, HCl, HBr, $Br_2$, HI, $I_2$ or the like can be used.

For etching gases for the amorphous silicon, for example, $CF_4$+$O_2$, $Cl_2$+$SF_6$ or the like can be used.

The sputtering gas is not limited to Ar, and Ne, Xe or the like may be used other than Ar.

In addition, the adhesion layer 51 formed by the present invention can be used not only for a source electrode and a drain electrode of the TFT but also for a gate electrode of the TFT and a barrier film and an electrode (wiring film) of other electronic parts (such as, a semiconductor element, a wiring plate or the like).

EXAMPLES

A copper alloy target 111 was sputtered with an argon gas used as a sputtering gas and an oxygen gas used as an oxidizing gas, an adhesion layer 51 was formed to 50 nm thick on a glass substrate, and thereafter a metallic low-resistance layer 52 was formed to 300 nm thick on the adhesion layer 51 by sputtering a pure copper target 112 by means of the argon gas, thereby obtaining a metal wiring film of a two-layer structure. The temperature of the substrate was 100° C., the sputtering gas was Ar gas, and the sputtering pressure was 0.4 Pa.

Following exposure of a surface of the formed metallic wiring film to be exposed to a hydrogen plasma, a film of silicon nitride was formed on the surface thereof.

The treatment with a hydrogen gas plasma was such that the flow rate of the hydrogen gas was 500 sccm, the pressure was 200 Pa, the temperature of the substrate was 250° C., the power was 300 W and the time was 60 seconds.

The silicon nitride film was formed such that respective gases were introduced into a CVD apparatus, in which the substrate was arranged, at the rates of $SiH_4$: 20 sccm, $NH_3$ gas: 300 sccm and $N_2$ gas: 500 sccm, the pressure was 120 Pa, the temperature of the substrate was 250° C., and the power was 300 W.

Adhesion as deposited (i.e., adhesion of a film, which when immediately after formation still remains to be treated in ways that include annealing) of the metallic wiring film before the exposure to the hydrogen plasma and adhesion (adhesion after the H₂ plasma treatment) after the formation of a film of silicon nitride on a surface thereof, following the exposure to the hydrogen plasma, were measured by a tape test in which an adhesive tape was adhered and was then peeled. Evaluations were carried out by taking examples having surfaces of the glass substrates marked with crosses "X", and ones other than the above marked with circles "○".

Experiments were carried out, while content rate of Al in the copper alloy target 111 and the introduction rate of an oxidizing gas were changed. Test results are shown as "adhesion" in the following Tables 1 to 3 together with the content rate of Al in the copper alloy target 111 and the introduction rate of the oxidizing gas.

Also, after the same metallic wiring film, as explained above, was formed on a surface of a silicon wafer, it was annealed in a vacuum atmosphere; and following the removal of the metallic wiring film by etching, the surface was observed to determine if there was a diffusion of copper into the silicon with an SEM.

In each of the experiments, the sputtering gas was argon gas, the oxidizing gas was oxygen gas, and the partial pressure of the sputtering gas in the sputtering atmosphere was 0.4 Pa.

Further, a target including Al was sputtered by means of a $CO_2$ gas and $H_2O$ as oxidizing gas in place of oxygen gas. With Ar gas used as a sputtering gas and Ti used as an additive metal, adhesion and barrier properties were evaluated.

Test results were shown as "Barrier property" in the following Table 1 (with oxygen gas used as the oxidizing gas), Table 2 (with $CO_2$ used as the oxidizing gas), and Table 3 (with $H_2O$ used as the oxidizing gas). Examples in which diffusion was observed were marked with crosses "X", while those in which diffusion was not observed were marked with circles "○".

TABLE 1

Adhesion, barrier property and $H_2$ plasma resistance (oxygen gas)

| Cpper alloy | Al addition amount (at %) | $O_2$ addition amount (%) | Adhesion | Barrier property 300° C. | Adhesion after $H_2$ plasma treatment |
|---|---|---|---|---|---|
| Cu/Cu—Al—O | 3 | 0 | X | X | X |
| | | 0.1 | X | X | X |
| | | 0.5 | X | X | X |
| | | 1 | ○ | ○ | X |
| | | 2 | ○ | ○ | X |
| | | 3 | ○ | ○ | X |
| | | 5 | ○ | ○ | X |
| | | 10 | ○ | ○ | X |
| | | 15 | ○ | ○ | X |
| | 5 | 0 | X | X | X |
| | | 0.1 | ○ | ○ | ○ |
| | | 0.5 | ○ | ○ | ○ |
| | | 1 | ○ | ○ | ○ |
| | | 2 | ○ | ○ | ○ |
| | | 3 | ○ | ○ | ○ |
| | | 5 | ○ | ○ | X |
| | | 10 | ○ | ○ | X |
| | | 15 | ○ | ○ | X |
| | 15 | 0 | ○ | X | ○ |
| | | 0.1 | ○ | ○ | ○ |
| | | 0.5 | ○ | ○ | ○ |
| | | 1 | ○ | ○ | ○ |
| | | 2 | ○ | ○ | ○ |
| | | 3 | ○ | ○ | ○ |
| | | 5 | ○ | ○ | ○ |
| | | 10 | ○ | ○ | X |
| | | 15 | ○ | ○ | X |
| | 30 | 0 | ○ | X | ○ |
| | | 0.1 | ○ | ○ | ○ |

TABLE 1-continued

Adhesion, barrier property and $H_2$ plasma resistance (oxygen gas)

| Cpper alloy | Al addition amount (at %) | $O_2$ addition amount (%) | Adhesion | Barrier property 300° C. | Adhesion after $H_2$ plasma treatment |
|---|---|---|---|---|---|
| | | 0.5 | ○ | ○ | ○ |
| | | 1 | ○ | ○ | ○ |
| | | 2 | ○ | ○ | ○ |
| | | 3 | ○ | ○ | ○ |
| | | 5 | ○ | ○ | ○ |
| | | 10 | ○ | ○ | ○ |
| | | 15 | ○ | ○ | ○ |

TABLE 2

Adhesion, barrier property and $H_2$ plasma resistance ($CO_2$ gas)

| Cpper alloy | Al addition amount (at %) | $CO_2$ addition amount (%) | Adhesion | Barrier property 300° C. | Adhesion after $H_2$ plasma treatment |
|---|---|---|---|---|---|
| Cu/Cu—Al—O | 15 | 0 | ○ | X | ○ |
| | | 0.2 | ○ | ○ | ○ |
| | | 0.4 | ○ | ○ | ○ |
| | | 0.8 | ○ | ○ | ○ |
| | | 2 | ○ | ○ | ○ |
| | | 5 | ○ | ○ | ○ |
| | | 10 | ○ | ○ | ○ |
| | | 20 | ○ | ○ | ○ |
| | | 30 | ○ | ○ | X |
| | 30 | 0 | ○ | X | ○ |
| | | 0.2 | ○ | ○ | ○ |
| | | 0.4 | ○ | ○ | ○ |
| | | 0.8 | ○ | ○ | ○ |
| | | 2 | ○ | ○ | ○ |
| | | 5 | ○ | ○ | ○ |
| | | 10 | ○ | ○ | ○ |
| | | 20 | ○ | ○ | ○ |
| | | 30 | ○ | ○ | ○ |

TABLE 3

Adhesion, barrier property and $H_2$ plasma resistance ($H_2O$ gas)

| Cpper alloy | Al addition amount (at %) | $H_2O$ addition amount (%) | Adhesion | Barrier property 300° C. | Adhesion after $H_2$ plasma treatment |
|---|---|---|---|---|---|
| Cu/Cu—Al—O | 15 | 0 | ○ | X | ○ |
| | | 0.1 | ○ | ○ | ○ |
| | | 0.5 | ○ | ○ | ○ |
| | | 1 | ○ | ○ | ○ |
| | | 2 | ○ | ○ | ○ |
| | | 3 | ○ | ○ | ○ |
| | | 5 | ○ | ○ | ○ |
| | | 10 | ○ | ○ | ○ |
| | | 15 | ○ | ○ | X |
| | 30 | 0 | ○ | X | ○ |
| | | 0.1 | ○ | ○ | ○ |
| | | 0.5 | ○ | ○ | ○ |
| | | 1 | ○ | ○ | ○ |
| | | 2 | ○ | ○ | ○ |
| | | 3 | ○ | ○ | ○ |
| | | 5 | ○ | ○ | ○ |
| | | 10 | ○ | ○ | ○ |
| | | 15 | ○ | ○ | ○ |

The results, as listed above, indicate that, when Al at at least 5 atom % was included in the copper alloy target 111, adhesion (adhesion before and after the $H_2$ plasma treatment) and barrier properties were found to be good.

It has also been discovered that the oxidizing gas should be introduced in a range of between at least 0.1 parts by volume and at most 30 parts by volume relative to an introduction amount of 100 parts by volume of the argon gas.

Next, the metal wiring film obtained by using the oxygen gas as the oxidizing gas was immersed into an etching liquid, then it was determined whether it was possible to etch both the metallic low-resistance layer 52 and the adhesion layer 51 with the same etching liquid. Phosphoric/nitric/acetic acids ($H_3PO_4:HNO_3:CH_3COOH:H_2O$)=16:1:2:1 was used in the etching liquid, of which temperature was set at 40° C.

Test results in the etching are shown in the following Table 4. Examples in which the width of the adhesion layer is equivalent to that of the metallic low-resistance layer after the etching are shown by a circle "○", while examples in which the width of the adhesion layer is different from that of the metallic low-resistance layer after the etching are shown by a cross "X". Test results are provided in the following Table 4 together with the content rate of Al in the copper alloy target 111.

TABLE 4

| Al addition amount and etching property | |
|---|---|
| Addition amount X(at %) | Wet-etched shape Cu—X at % Al |
| 0 | ○ |
| 3 | ○ |
| 5 | ○ |
| 7 | ○ |
| 10 | ○ |
| 15 | ○ |
| 30 | ○ |
| 50 | X |
| 75 | X |
| 100 | X |

Table 4 shows that, since the widths of the adhesion layer and the metallic low-resistance layer may differ substantially, the addition amount of Al in the copper alloy target 111 is at a desirable amount of at most 30 atom %.

Moreover, since adhesion of the adhesion layer 51 to silicon or silicon oxide, as well as to the metallic low-resistance layer 52, is desirably higher, the adhesion layer 51 in the present invention includes at least 50% of copper as a component of the metallic low-resistance layer 52.

What is claimed is:

1. A method for producing a thin film transistor of an inverted staggered type, comprising the steps of:
   forming a gate electrode on an object to be processed;
   forming a gate insulation layer on the gate electrode;
   forming a semiconductor layer on the gate insulation layer;
   forming an ohmic contact layer on the semiconductor layer;
   forming a metallic wiring layer on the ohmic contact layer; and
   forming first and second ohmic contact layers, a source electrode, and a drain electrode by patterning the ohmic contact layer and the metallic wiring film,
   wherein the step of forming the metallic wiring film includes a step of sputtering a target of a copper alloy having Al and copper, with Al being included at a rate of between at least 5 atom % and at most 30 atom %, in a vacuum atmosphere with a gas, including a sputtering gas and an oxidizing gas, for forming an adhesion layer having copper, Al and oxygen on the ohmic contact layer.

2. The method for producing the thin film transistor as set forth in claim 1, further comprising the step of, after forming the adhesion layer, forming a metallic low-resistance layer on the adhesion layer, the metallic low-resistance layer having a higher copper content rate than that of the adhesion layer and a resistance lower than that of the adhesion layer.

3. The method for producing the thin film transistor as set forth in claim 1, wherein $O_2$ gas is used as the oxidizing gas, and the $O_2$ gas is included in a range of between at least 0.1 parts by volume and at most 15 parts by volume relative to 100 parts by volume of the sputtering gas.

4. The method for producing the thin film transistor as set forth in claim 1, wherein $CO_2$ gas is used as the oxidizing gas, and the $CO_2$ gas is included in a range of between at least 0.2 parts by volume and at most 30 parts by volume relative to 100 parts by volume of the sputtering gas.

5. The method for producing the thin film transistor as set forth in claim 1, wherein $H_2O$ gas is used as the oxidizing gas, and the $H_2O$ gas is included in a range of between at least 0.1 parts by volume and at most 15 parts by volume relative to 100 parts by volume of the sputtering gas.

6. A thin film transistor of an inverted staggered type, comprising:
   a gate electrode formed on an object to be processed;
   a gate insulation layer formed on the gate electrode;
   a semiconductor layer formed on the gate insulation layer;
   first and second ohmic contact layers, which are separated from each other, formed on the semiconductor layer; and
   a source electrode and a drain electrode formed on the first and the second ohmic contact layers, respectively,
   wherein the source electrode and the drain electrode have adhesion layers on surfaces which contacts to the first and the second ohmic contact layers, the adhesion layers having a copper alloy including Al and oxygen,
   wherein Al is included at a rate of between at least 5 atom % and at most 30 atom % in the copper alloy which is included in the adhesion layer.

7. The thin film transistor as set forth in claim 6, wherein the first and second ohmic contact layers are n-type semiconductor layers.

8. The thin film transistor as set forth in claim 6, wherein a metallic low-resistance layer, which has a content rate of copper higher than that of the adhesion layer and a resistance lower than that of the adhesion layer, is arranged on the adhesion layer.

* * * * *